(12) United States Patent  
Xu et al.

(10) Patent No.: US 10,193,103 B2  
(45) Date of Patent: Jan. 29, 2019

(54) ORGANIC LIGHT EMITTING DEVICE HAVING PROTRUSION FORMED OF TRANSPARENT MATERIAL AND DISPLAY APPARATUS

(71) Applicant: BOE TECHNOLOGY GROUP CO., LTD., Beijing (CN)

(72) Inventors: Xiaowei Xu, Beijing (CN); Chunping Long, Beijing (CN); Lei Shi, Beijing (CN); Wenqing Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 110 days.

(21) Appl. No.: 14/770,365

(22) PCT Filed: Dec. 13, 2014

(86) PCT No.: PCT/CN2014/093766  
§ 371 (c)(1),  
(2) Date: Aug. 25, 2015

(87) PCT Pub. No.: WO2016/041275  
PCT Pub. Date: Mar. 24, 2016

(65) Prior Publication Data  
US 2016/0372702 A1 Dec. 22, 2016

(30) Foreign Application Priority Data

Sep. 15, 2014 (CN) .......................... 2014 1 0469964

(51) Int. Cl.  
*H01L 29/08* (2006.01)  
*H01L 51/52* (2006.01)  
(Continued)

(52) U.S. Cl.  
CPC .......... *H01L 51/5253* (2013.01); *H01L 27/32* (2013.01); *H01L 27/3246* (2013.01); *H01L 51/50* (2013.01); *H01L 51/52* (2013.01)

(58) Field of Classification Search  
CPC combination set(s) only.  
See application file for complete search history.

(56) References Cited

U.S. PATENT DOCUMENTS 5,836,809 A 11/1998 Kosic  
7,009,340 B2 3/2006 Asai et al.  
(Continued)

FOREIGN PATENT DOCUMENTS

CN 1561149 A 1/2005  
CN 1748878 A 3/2006  
(Continued)

OTHER PUBLICATIONS

Kai et al JP2008210728A machine translation.*  
(Continued)

*Primary Examiner* — Matthew Gordon  
(74) *Attorney, Agent, or Firm* — Collard & Roe, P.C.

(57) ABSTRACT

An organic light emitting device and a display apparatus are disclosed. The organic light emitting device includes an array substrate and a package substrate (2); on a side of the package substrate (2) facing the array substrate, there is provided a protrusion (7) formed of a first transparent material, a surface of the protrusion (7) is also covered with a transparent layer (8) formed of a second transparent material, and the refractive index of the second transparent material is larger than the refractive index of the first transparent material. With the organic light emitting device, a part of light that is emitted from an organic light-emitting layer (5) and irradiated to a surface of the protrusion (7) is totally reflected and changed in optical paths to decrease (Continued)

incident light totally reflected at a boundary between the package substrate (2) and the outside air, and light that has been changed in optical paths is irradiated out through the package substrate (2) more easily, thereby improving the output efficiency of light.

20 Claims, 3 Drawing Sheets

(51) Int. Cl.
*H01L 51/50* (2006.01)
*H01L 27/32* (2006.01)

(56) References Cited

U.S. PATENT DOCUMENTS

| | | |
|---|---|---|
| 2012/0286258 A1 | 11/2012 | Naraoka et al. |
| 2013/0343063 A1 | 12/2013 | Park et al. |
| 2014/0001448 A1 | 1/2014 | Naraoka et al. |

FOREIGN PATENT DOCUMENTS

| | | |
|---|---|---|
| CN | 101884983 A | 11/2010 |
| CN | 202076333 U | 12/2011 |
| CN | 102489470 A | 6/2012 |
| CN | 102742352 A | 10/2012 |
| CN | 202977537 U | 6/2013 |
| CN | 103212549 A | 7/2013 |
| CN | 103515409 A | 1/2014 |
| CN | 103815853 A | 5/2014 |
| CN | 104037357 A | 9/2014 |
| CN | 104494922 A | 4/2015 |
| JP | H 07-283185 A | 10/1995 |
| JP | 2001-102283 A | 4/2001 |
| JP | 2004-056005 A | 2/2004 |
| JP | 2008-210728 A | 9/2008 |
| JP | 2012-124103 A | 6/2012 |
| TW | 201028220 A | 8/2010 |
| WO | 2012/090712 A1 | 7/2012 |
| WO | 2013/137184 A1 | 9/2013 |

OTHER PUBLICATIONS

Kawaguchi et al JP2012124103A machine translation.*
English machine translation of Kawaguchi et al. JP2012124103A.*
English machine translation of Kai et al. JP2008210728A.*
Chinese Office Action in Chinese Application No. 201410469964.0, dated Apr. 12, 2016 with English translation.
International Search Report of PCT/CN2014/093766 in Chinese, dated Jun. 24, 2015 with English translation.
Notice of Transmittal of the International Search Report of PCT/CN2014/093766 in Chinese, dated Jun. 24, 2015.
Written Opinion of the International Searching Authority of PCT/CN2014/093766 in Chinese, dated Jun. 24, 2015 with English translation.
Second Chinese Office Action in Chinese Application No. 201410469964.0, dated Jun. 17, 2016 with English translation.

* cited by examiner

ORGANIC LIGHT EMITTING DEVICE HAVING PROTRUSION FORMED OF TRANSPARENT MATERIAL AND DISPLAY APPARATUS

CROSS REFERENCE TO RELATED APPLICATIONS

This application is the National Stage of PCT/CN2014/093766 filed on Dec. 13, 2014, which claims priority under 35 U.S.C. § 119 of Chinese Application No. 201410469964.0 filed on Sep. 15, 2014, the disclosure of which is incorporated by reference.

TECHNICAL FIELD

At least an embodiment of the present invention relates to an organic light emitting device and a display apparatus.

BACKGROUND

An organic light emitting device (OLED) is considered to have a great application prospect in flat panel display as it has many advantages such as self illumination, all solid state, wide viewing angle, fast response and so on, and is a new generation of flat panel display products subsequent to liquid crystal displays (LCDs) and plasma display panels (PDPs).

SUMMARY

According to at least one embodiment of the present invention, there are provided an organic light emitting device and a display apparatus, so as to improve the output efficiency of light of the OLED device.

According to at least one embodiment of the invention, there is provided an organic light emitting device, which includes an array substrate and a package substrate; on a side of the package substrate facing the array substrate, there is provided a protrusion formed of a first transparent material, a surface of the protrusion is covered with a transparent layer formed of a second transparent material, and the refractive index of the second transparent material is larger than the refractive index of the first transparent material.

According to at least one embodiment of the invention, there is further provided a display apparatus, which includes the above organic light emitting device.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical terminology or scientific terminology used in the present disclosure should have the same meaning as commonly understood by one of ordinary skill in the art to which this invention belongs. "First", "second" and the like used in the present disclosure do not show any order, number or importance, but are only used to distinguish different constituent parts. Likewise, a term "a," "an," or the like does not indicate limitation in number, but specifies the presence of at least one. A term "comprises," "comprising," "includes," "including", "contains" or the like means that an element or article ahead of this term encompasses element(s) or article(s) listed behind this term and its(their) equivalents, but does not preclude the presence of other elements or articles. A term "connection," "connected," or the like is not limited to physical or mechanical connection, but can include electrical connection, whether directly or indirectly. "Upper," "lower," "left," "right" or the like is only used to describe a relative positional relationship, and when an absolute position of the described object is changed, the relative positional relationship might also be changed accordingly.

Figure 1:
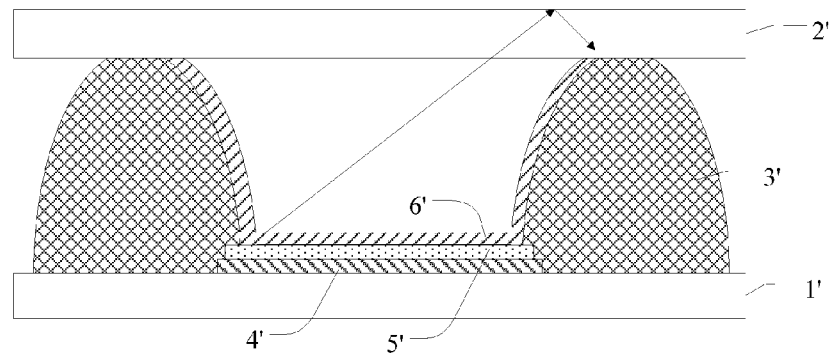
FIG. 1 is a schematic view illustrating an organic light emitting device.

In the study, inventors of the present application have noted that, in an OLED device, there is refractivity difference between different structures owing to their difference in materials, which results in that most of light is totally reflected at the boundary between different structures and cannot be extracted out. FIG. 1 is a structurally schematic view illustrating an OLED device, which includes an array substrate and a package substrate 2'. The array substrate includes a base substrate 1', an anode layer 4', a pixel defining layer (PDL) 3', a cathode layer 6' and an organic light-emitting layer 5' between the anode layer 4' and the cathode layer 6'. Light emitted by the organic light-emitting layer 5' is irradiated out through the package substrate 2'. However, as the refractive index of the package substrate 2' is larger than the refractive index of the outside air, a part of light incident to the boundary cannot be emergent through the package substrate 2' due to the total reflection, thereby reducing the output efficiency of light of the OLED device.

Figure 2:
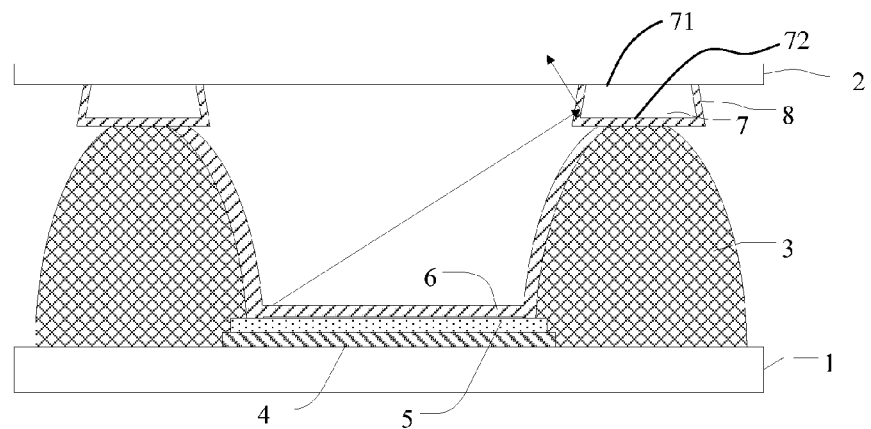
FIG. 2 is a schematic view illustrating an organic light emitting device provided by an embodiment of the invention.

FIG. 2 is a schematic view illustrating an organic light emitting device provided by an embodiment of the present invention, which includes an array substrate and a package substrate 2. The array substrate includes a base substrate 1, an anode layer 4, a pixel defining layer (PDL) 3, a cathode layer 6 and an organic light-emitting layer 5 between the anode layer 4 and the cathode layer 6. A protrusion 7 formed of a first transparent material is provided on a side, facing the array substrate, of the package substrate, the surface of the protrusion 7 is also covered with a transparent layer 8 formed of a second transparent material, and the refractive index of the second transparent material is larger than the refractive index of the first transparent material.

With respect to the organic light emitting device provided by an embodiment of the invention, a protrusion is formed on a side of the package substrate facing the array substrate, and a transparent layer with a refractive index larger than that of the protrusion is formed on the surface of the protrusion, thus when light emitted by an organic light-emitting layer is irradiated onto the surface of the protrusion, a part of light irradiated to the surface of the protrusion is totally reflected and the optical path is changed owing to the fact that the refractive index of the protrusion is smaller than the refractive index of the transparent layer, so as to decrease the incident light totally reflected at a boundary between the package substrate and the outside air, and this enables light, the optical paths of which have been changed, to be emergent through the package substrate more easily. Thus, the output efficiency of light of the OLED device is improved.

In the organic light emitting device provided by an embodiment of the invention, the protrusion(s) on the package substrate can be obtained by a variety of methods. For example, it is possible that a glass substrate is etched, and thus a plurality of protrusion structures is formed on a package substrate while the package substrate is obtained. In addition, it is also possible that a transparent organic material is used to produce protrusions on a glass substrate. For example, a negative photoresist may be used to produce the protrusions, that is, the first transparent material may include a negative photoresist. For example, polyimide, acylic, phenolic resin or the like may be used, and for example, AZ CTP-100 negative photoresist can be used.

Figure 3:
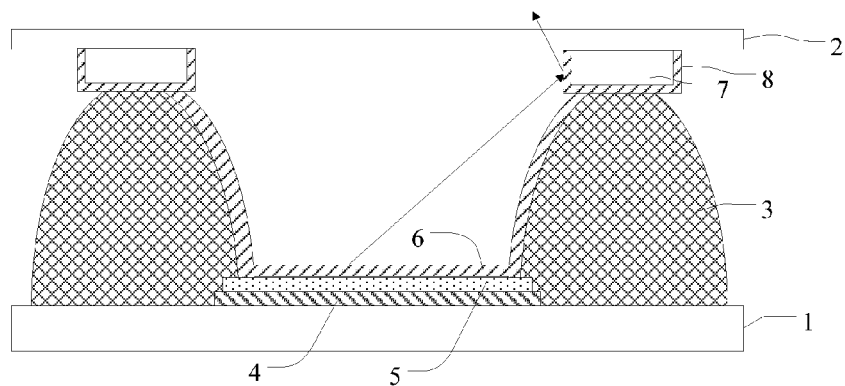
FIG. 3 is a schematic view illustrating another organic light emitting device provided by an embodiment of the invention.
Figure 4:
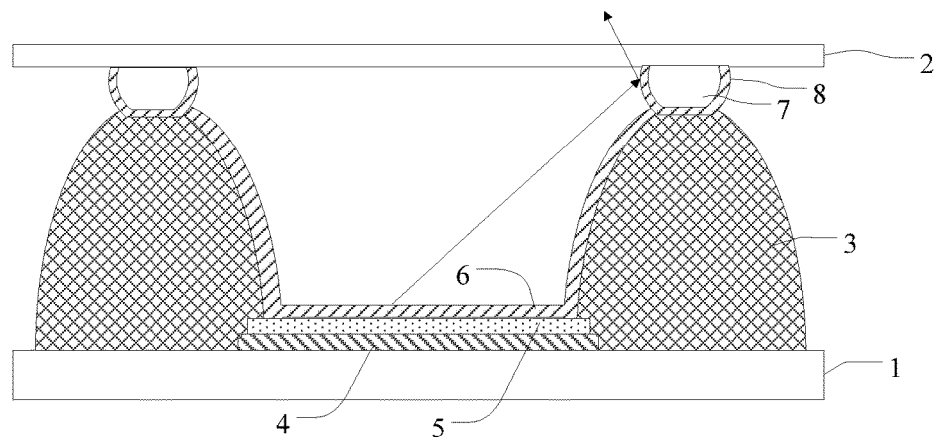
FIG. 4 is a schematic view illustrating still another organic light emitting device provided by an embodiment of the invention.

With regard to the sectional shape of the protrusion in a direction perpendicular to the package substrate in at least one embodiment of the present invention, it not only can be a trapezoid as illustrated in FIG. 2, a rectangle as illustrated in FIG. 3, and a triangle and other polygonal shape, but also can be the shape of a "bowl" as illustrated in FIG. 4 and other approximately polygonal shape, so that a part of light irradiated to a surface of the protrusion can be totally reflected and the optical path is changed accordingly with the aid of the transparent layer on a surface of the protrusion. Thereby, the incident light totally reflected at a boundary between the package substrate and the outside air is decreased. And, this enables light, optical paths of which have been changed, to be emergent through the package substrate more easily. Consequently, the output efficiency of light of the OLED device is improved.

Figure 5:
FIGS. 5 to 7 are schematic views illustrating formation of protrusions and a transparent layer on a package substrate in an embodiment of the invention.
Figure 6:
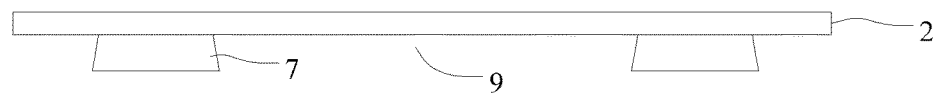
Figure 7:
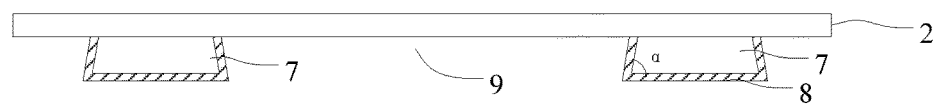

In at least one embodiment, for the sake of reducing the production costs and enable light that has been changed in its optical path to be emergent through the package substrate more easily, as shown in FIG. 2, the cross-section of a protrusion taken in a direction perpendicular to the package substrate can be set to be of a trapezoid, and an upper base 71 of the trapezoid faces the package substrate, and the lower base 72 of the trapezoid faces the array substrate, thereby forming a positive trapezoidal shape (the length of the upper base 71 is smaller than the length of the lower base 72). For example, the protrusion in the shape of a positive trapezoid may be formed by a negative photoresist. For example, with reference to FIG. 5, a layer of negative photoresist 10 is formed on a package substrate 2 firstly; next, exposure and development are conducted on it, with reference to FIG. 6, thereby forming a protrusion 7 in an exposed region, and forming a recess 9 in an unexposed region; and subsequently, a transparent layer 8 formed of a second transparent material is formed on a surface of the protrusion 7, thereby obtaining the structure illustrated in FIG. 7. In at least one embodiment, a cross-section of the protrusion 7 may be of an isosceles trapezoid, as illustrated in FIG. 7. For example, a base angle α of the trapezoid may be in the range of 35 degrees to 75 degrees, and for example, it may be 55 degrees, 70 degrees, or the like. As compared with a protrusion of the other sectional shape, the protrusion in the shape of a positive trapezoid can be formed merely by exposure and development of a negative photoresist, without need of other manufacturing process, and therefore the manufacturing process of it is relatively simple, and the manufacturing costs become less.

In at least one embodiment, the above transparent layer may be formed on a surface of the protrusion by means of sputtering. In at least one embodiment, the thickness of the transparent layer may be in the range of 50 nm to 1000 nm, and for example, it may be 100 nm, 300 nm, 500 nm, 800 nm, or the like. For example, the second transparent material for forming the transparent layer may also have electrical conductivity, thereby endowing the transparent layer with electrical conductivity, and making the transparent layer in contact with a cathode layer on the array substrate, whereby the transparent layer and the cathode layer are formed into a parallel connection structure, and thus the resistance of the cathode layer is decreased, the power consumption of the OLED device is reduced. For example, the second transparent material may include any one of ITO (indium tin oxide), AZO (Al doped ZnO) and FTO (tin oxide doped with fluorine)

Figure 8:
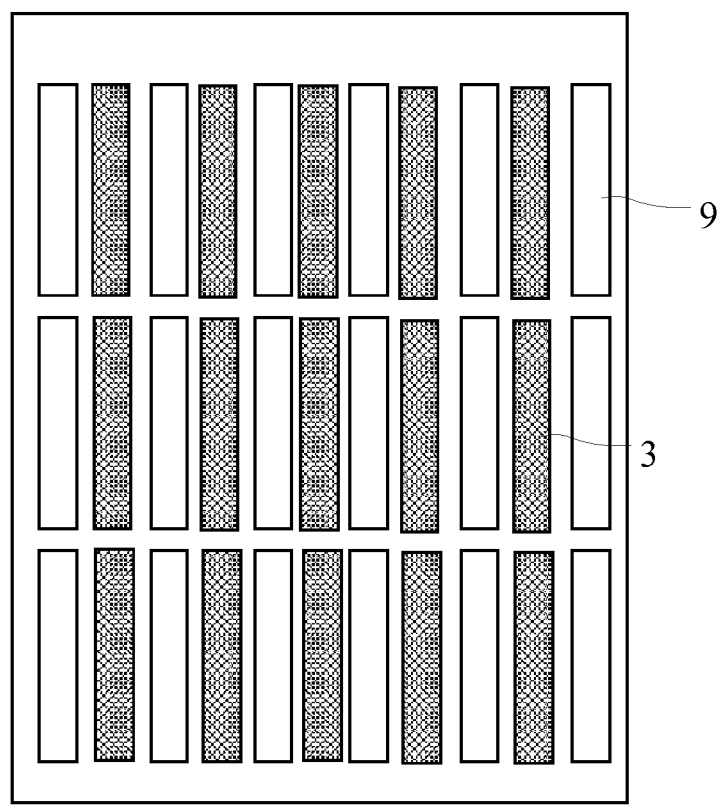
FIG. 8 is a schematic view illustrating distribution of recesses and a pixel defining layer on a package substrate in an organic light emitting device provided by an embodiment of the invention.

In the organic light emitting device provided by an embodiment of the invention, the anode layer 4 on the array substrate may be formed into the desired shape through photolithography and etching processes. The pixel defining layer 3 covers the anode layer 4 in part, and a light-emitting region is exposed by the anode layer 4. The material selectable for the pixel defining layer includes polyimide, acrylic, phenolic resin or other material; and for example, its thickness may be in the range of 1 to 3 μm. The pixel defining layer may be formed into the desired shape by a photolithography process, and the slope angle of it may also be improved through UV illumination of 150 to 700 mj. The material for the cathode layer 6 may be a metal or an alloy of two or more metals. In at least one embodiment, it is possible that the formed protrusion 7 and the pixel defining layer 3 are disposed to be exactly opposed to each other, so the relative position between the recesses 9 and the pixel defining layer 3 on a package substrate is illustrated in FIG. 8. When light emitted from an organic light-emitting layer is irradiated to a side face of a recess 9 (namely, a lateral waist face of a protrusion), as the side face is covered with a transparent layer 8 having a refractive index larger than that of the protrusion 7, a part of light irradiated to the side face is totally reflected and changed in their optical paths. In this way, not only incident light totally reflected at the boundary between the package substrate and the outside air can be decreased, so that light that has been changed in the optical paths is irradiated out through the package substrate more easily, but also the impact on overall transmittance of the package substrate can be reduced. In addition, by means of arranging the protrusion and the pixel defining layer to be exactly opposed to each other, the effective display area (AA) of the organic light emitting device can also be raised in height, and therefore it is avoided that upon package, package effects are affected owing to different heights of a packaging area and the effective display area (AA).

Additionally, at least one embodiment of the present invention further provides a display apparatus, which includes any of the above-described organic light emitting device. The display apparatus provided by any embodiment of the invention may be an OLED panel, an electronic paper, a notebook display screen, a liquid crystal display, a liquid crystal television, a digital photo frame, a cell phone, a tablet computer or any other product or component having a display function.

Descriptions made above are merely exemplary embodiments of the invention, but are not used to limit the protection scope of the invention. The protection scope of the invention is determined by the attached claims.

This application claims the benefit of priority from Chinese patent application No. 201410469964.0, filed on Sep. 15, 2014, the disclosure of which is incorporated herein by reference in its entirety as a part of the present application.

What is claimed is:

1. An organic light emitting device, comprising an array substrate and a package substrate, wherein on a side of the package substrate facing the array substrate, there is provided a protrusion formed of a first transparent material, a surface of the protrusion is covered with a transparent layer formed of a second transparent material, and a refractive index of the second transparent material is larger than a refractive index of the first transparent material;

a recess is disposed between the protrusions covered with the transparent layer of the second transparent material, and a side face of the recess is covered with the transparent layer of the second transparent material having the refractive index larger than that of the first transparent material of the protrusion, so that a part of light irradiated to the side face is totally reflected and changed in optical paths;

wherein the array substrate comprises a pixel defining layer formed thereon, and the transparent layer is directly contacted with the pixel defining layer.

2. The organic light emitting device claimed as claim 1, wherein, a sectional shape of the protrusion in a direction perpendicular to the package substrate is a polygonal shape or a shape of a bowl.

3. The organic light emitting device claimed as claim 1, wherein, a cross-section of the protrusion taken in a direction perpendicular to the package substrate is a rectangle or a triangle.

4. The organic light emitting device claimed as claim 1, wherein, a cross-section of the protrusion taken in a direction perpendicular to the package substrate is a trapezoid; an upper base of the trapezoid faces the package substrate, and a lower base of the trapezoid faces the array substrate.

5. The organic light emitting device claimed as claim 4, wherein, the trapezoid is an isosceles trapezoid.

6. The organic light emitting device claimed as claim 5, wherein, a base angle of the trapezoid is in the range of 35 degrees to 75 degrees.

7. The organic light emitting device claimed as claim 1, wherein the protrusion and the pixel defining layer are disposed to be exactly opposed to each other.

8. The organic light emitting device claimed as claim 1, wherein, the second transparent material has the electrical conductivity, and the transparent layer also contacts with a cathode layer on the array substrate.

9. The organic light emitting device claimed as claim 1, wherein, a thickness of the transparent layer is in the range of 50 nm to 1000 nm.

10. The organic light emitting device claimed as claim 1, wherein, the first transparent material includes a negative photoresist.

11. The organic light emitting device claimed as claim 1, wherein, the second transparent material includes any of indium tin oxide, zinc oxide doped with aluminum, and tin oxide doped with fluorine.

12. A display apparatus, comprising the organic light emitting device claimed as claim 1.

13. The organic light emitting device claimed as claim 2, wherein the protrusion and the pixel defining layer are disposed to be exactly opposed to each other.

14. The organic light emitting device claimed as claim 2, wherein, the second transparent material has the electrical conductivity, and the transparent layer also contacts with a cathode layer on the array substrate.

15. The organic light emitting device claimed as claim 2, wherein, a thickness of the transparent layer is in the range of 50 nm to 1000 nm.

16. The organic light emitting device claimed as claim 2, wherein, the first transparent material includes a negative photoresist.

17. The organic light emitting device claimed as claim 3, wherein the protrusion and the pixel defining layer are disposed to be exactly opposed to each other.

18. The organic light emitting device claimed as claim 3, wherein, the second transparent material has the electrical conductivity, and the transparent layer also contacts with a cathode layer on the array substrate.

19. The organic light emitting device claimed as claim 4, wherein the protrusion and the pixel defining layer are disposed to be exactly opposed to each other.

20. The organic light emitting device claimed as claim 4, wherein, the second transparent material has the electrical conductivity, and the transparent layer also contacts with a cathode layer on the array substrate.

* * * * *